(12) United States Patent
Lee et al.

(10) Patent No.: US 7,893,795 B2
(45) Date of Patent: Feb. 22, 2011

(54) CIRCUIT DEVICE HAVING INDUCTOR AND CAPACITOR IN PARALLEL CONNECTION

(75) Inventors: Min-Wei Lee, Taichung County (TW); Chin-Li Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 321 days.

(21) Appl. No.: 12/147,494

(22) Filed: Jun. 27, 2008

(65) Prior Publication Data

US 2009/0237178 A1    Sep. 24, 2009

(30) Foreign Application Priority Data

Mar. 20, 2008    (TW) .............................. 97109909 A

(51) Int. Cl.
*H03H 7/01*    (2006.01)
*H01P 7/08*    (2006.01)
*H01P 1/203*   (2006.01)

(52) U.S. Cl. ..................... 333/175; 333/204; 333/219
(58) Field of Classification Search ......... 333/138–140, 333/161, 162, 165–158, 175, 176, 185, 202, 333/204, 205, 238, 246
See application file for complete search history.

(56) References Cited

U.S. PATENT DOCUMENTS

| 3,947,934 | A  | * | 4/1976 | Olson ......................... 29/25.42 |
| 6,094,112 | A  | * | 7/2000 | Goldberger et al. ......... 333/185 |
| 6,346,859 | B1 | * | 2/2002 | Saitou ......................... 330/286 |
| 6,713,162 | B2 | * | 3/2004 | Takaya et al. ............... 428/209 |
| 7,321,284 | B2 | * | 1/2008 | Chen et al. .................. 336/200 |

OTHER PUBLICATIONS

Article titled "Compact Harmonic Filter Design and Fabrication Using IPD Technology", authored by Liu, et al., adopted from 2005 Electronic Components and Technology Conference, pp. 757-763.

\* cited by examiner

*Primary Examiner*—Benny Lee
*Assistant Examiner*—Gerald Stevens
(74) *Attorney, Agent, or Firm*—Jianq Chyun IP Office

(57) ABSTRACT

A circuit device having an inductor and a capacitor in parallel connection includes a planar inductor embedded in an insulating material layer, wherein the planar inductor has a winding wire portion, a first connection terminal and a second connection terminal. The first connection terminal and the second connection terminal are located at different elevations and have an overlapping region. A capacitor dielectric layer is located within the overlapping region between the first connection terminal and the second connection terminal, and the capacitor dielectric layer and the first connection terminal and the second connection terminal together form a capacitor.

19 Claims, 6 Drawing Sheets

CIRCUIT DEVICE HAVING INDUCTOR AND CAPACITOR IN PARALLEL CONNECTION

CROSS-REFERENCE TO RELATED APPLICATION

This application claims the priority benefit of Taiwan application serial no. 97109909, filed on Mar. 20, 2008. The entirety of the above-mentioned patent application is hereby incorporated by reference herein and made a part of specification.

BACKGROUND OF THE INVENTION

1. Field of the Invention

The present invention generally relates to a circuit device having an inductor and a capacitor in parallel connection and the application thereof.

2. Description of Related Art

Along with the development tendency of electronic products that the light, slim, short and small requirements and the integration of multi functions, more and more circuit devices need to be integrated into a semiconductor chip. The inductance coupling device herein is one of indispensable devices in designing a semiconductor chip. The inductance coupling device is broadly used in various applications, which include a signal-converting mechanism application in numerous circuits or a cavity resonator coupling application in passive devices.

Taking a radio-frequency front stage circuit (RF front stage circuit) in a communication system as an example, a filter often plays an indispensable role, and the inductance coupling device is serving as a familiar and important component in a filter. Usually, the filter is laid out at the front-most stage of a system and in charge of allowing a signal with an operation bandwidth to pass the filter and blocking signals with other bandwidths. In terms of the said system, the signals with other bandwidths are considered as noise, which would quite affect the communication quality of the system.

In terms of a planar circuit with, for example, a microstrip-line environment or a strip-line environment, many ways exist to design a filter. Once the filter device needs to be integrated into a chip, considering the limitation of chip area, the filter can not be designed by using a quarter-wave coaxial cavity resonator architecture which is very common one in a planar circuit. Instead, the filter can be implemented by using LC architecture only, wherein the capacitor and the inductor are embedded in a chip.

In a filter design, for example, a resonance structure with an inductor and a capacitor in parallel connection is well known as a basic and important component. In a common chip design however, only a limited and unchanged number of inductors and capacitors embedded in a chip are allowed for designing the circuit; in addition, transmission lines are used to connect each independent inductor or capacitor so as to finish a required structure design. In comparison with the required design area of a capacitor, the area of an inductor is quite larger. To adapt the above-mentioned circumstance, additional connection lines are required for a resonance structure with an inductor and a capacitor in parallel connection, which not only increases the required area of the designed filter, but also brings an additional connection line effect. A designer must consider about it. Therefore, if the additional connection circuits can be reduced, the resonance structure with an inductor and a capacitor in parallel connection at least benefits the chip design with an embedded filter.

SUMMARY OF THE INVENTION

The present invention is directed to circuit device having an inductor and a capacitor in parallel connection, wherein the device at least can reduce the connection lines for connecting the capacitor.

An embodiment of the present invention provides a circuit device having an inductor and a capacitor in parallel connection. The device includes a planar inductor embedded in an insulating material layer, wherein the planar inductor has a winding wire portion, a first connection terminal and a second connection terminal. The first connection terminal and the second connection terminal are respectively located at different elevations and have an overlapping region with each other. A capacitor dielectric layer is located within the overlapping region between the first connection terminal and the second connection terminal, and the capacitor dielectric layer, the first connection terminal and the second connection terminal together form a capacitor.

Another embodiment of the present invention also provides a circuit device having an inductor and a capacitor in parallel connection. The device includes a planar inductor embedded in an insulating material layer, wherein the planar inductor includes a top conductive layer and a bottom conductive layer. The top conductive layer and the bottom conductive layer are respectively located at different elevations and have an overlapping region with each other. A capacitor dielectric layer is at least located within the overlapping region between the top conductive layer and the bottom conductive layer. The capacitor dielectric layer, the top conductive layer and the bottom conductive layer together form a capacitor, wherein the overlapping region includes at least a portion of an area region covered by the planar inductor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
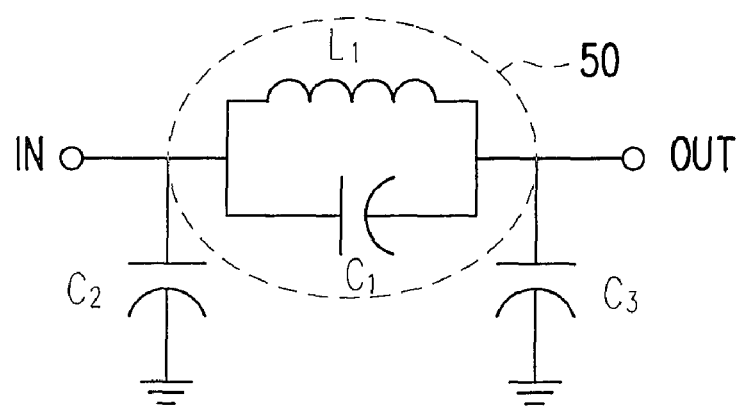
FIG. 1 is a diagram of an application circuit of the present invention in a semiconductor circuit design.

Reference will now be made in detail to the present preferred embodiments of the invention, examples of which are illustrated in the accompanying drawings. Wherever possible, the same reference numbers are used in the drawings and the description to refer to the same or like parts.

In a chip design, a planar spiral inductor is the most common embedded inductor. The planar spiral inductor herein can be fabricated by using semiconductor processes and used in association with other integrated circuits (ICs). FIG. 1 is a diagram of an application circuit of the present invention in a semiconductor circuit design. In general, a filter adopts a resonance structure having an inductor and a capacitor in parallel connection. Referring to FIG. 1, a resonance structure 50 includes, for example, an inductor $L_1$ and a capacitor $C_1$ in parallel connection and has an input end IN and an output end OUT. In terms of the design of a lowpass filter, the input end IN of the lowpass filter is connected to a grounded terminal through another capacitor $C_2$ and the output end OUT thereof is also connected to another grounded terminal through further a capacitor $C_3$. The resonance structure having an inductor and a capacitor in parallel connection can be applied to other circuits as well, for example, to a matching circuit, a bandpass filter, a duplexer, etc. FIG. 1 is only one of the application circuits of the present invention.

Figure 2:
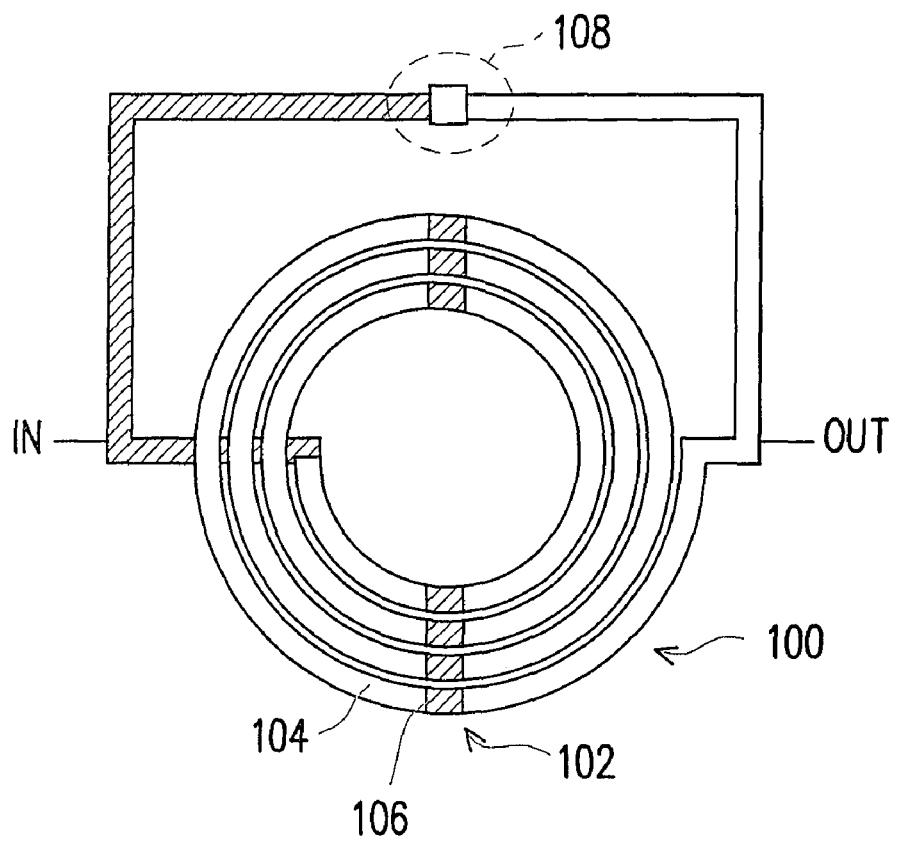
FIG. 2 is a schematic top view of a resonance structure having an inductor and a capacitor in parallel connection according to the embodiments of the present invention.

FIG. 2 is a schematic top view of a resonance structure having an inductor and a capacitor in parallel connection according to the embodiments of the present invention. Referring to FIG. 2, a resonance structure includes an inductor 100 formed by a winding wire and has two connection terminals, for example, an input end IN and an output end OUT. The capacitor 108 in parallel connected to the inductor 100 in the resonance structure is connected to the above-mentioned input end IN and output end OUT through two extension conductive lines. Two ends of the two conductive lines form an overlapping portion, where there is a capacitor dielectric layer between the two conductive lines to form a capacitor 108. The inductor formed by a winding wire 100 is fabricated with a winding wire with multi layers, which include two conductive layers 104 and 106 both are on the external skin of the winding wire. According to the elevations of the two conductive layers in FIG. 2, they are respectively termed as a top conductive layer 104 and a bottom conductive layer 106 for depiction convenience. Each of the conductive layers can be continuously distributed or discontinuously distributed. In the embodiment, the top conductive layer 104 is, for example, discontinuously distributed and has, for example, a separating region 102; but the top conductive layer 104 can be continuously distributed as well. It is allowed to have other conductive layers between the top conductive layer 104 and the bottom conductive layer 106. In the embodiment, the winding wire is wound from the outer side towards the inner side. Specifically, for example, the bottom conductive layer 106 at the inner side can transversely cross the winding wire by a winding wire structure with multi interrupted layers and extended to the outer side for connection convenience.

In comparison with the capacitor 108 in the embodiment, the inductor 100 occupies a larger design area of a chip. Since the sizes of the inductor and the capacitor are much different from each other, two long transmission lines are used for connections in the resonance structure having an inductor and a capacitor in parallel connection herein. The transmission lines also occupy a certain design area of the chip. In addition, an extra unnecessary coupling effect between the inductor and the capacitor or between the inductor and the transmission lines may occur.

Figure 3:
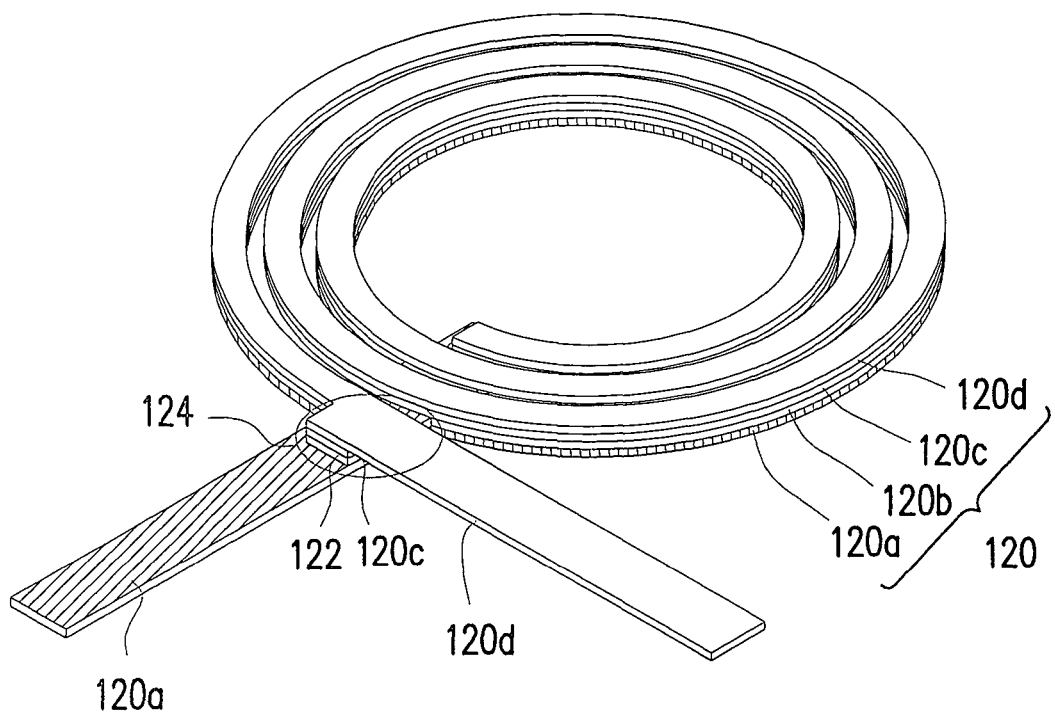
FIG. 3 is a 3-D schematic drawing of a resonance structure having an inductor and a capacitor in parallel connection according to an embodiment of the present invention.

The present invention provides a plurality of embodiments with different modified capacitors. FIG. 3 is a 3-D schematic drawing of a resonance structure having an inductor and a capacitor in parallel connection according to an embodiment of the present invention. Referring to FIG. 3, the embodiment takes a structure with four layers as an example, wherein an inductor 120 is exemplarily a planar inductor. The inductor 120 includes, for example, four conductive layers 120a, 120b, 120c and 120d. According to the elevations shown in FIG. 3, the conductive layer 120a is located at the bottom and the conductive layer 120d is located at the top. One of the internal layers, for example the conductive layer 120b, has a thickness depending on the thickness of a dielectric layer 122 of a capacitor 124, so that the fabrication thereof is more convenient. In addition, the thickness of the conductive layer 120c is also depending on the thickness of the dielectric layer 122, so that the planar design of the capacitor and the inductor respectively having the same thickness can be achieved.

A connection terminal of the bottom conductive layer 120a, for example, passes through the winding wire portion from the inner side and reaches the outer side, where the bottom conductive layer 120a is crossly overlapped with the top conductive layer 120d. The crossly overlapping region is used to fabricate the capacitor in parallel connection, wherein during fabricating, for example, the conductive layer 120c, the dielectric layer 122 within the region of the capacitor 124 is preserved as the capacitor dielectric layer. In the embodiment, the capacitor 124 is, for example, adjacent to the inductor by design, which however is not only one design in the same spirit. Since the conductive layer 120a and the conductive layer 120d at different elevations must have an overlapping region, the capacitor can be disposed at any appropriate position within the overlapping region; for example, the capacitor can be disposed at the overlapping portion of the winding wire region itself.

Figure 4:
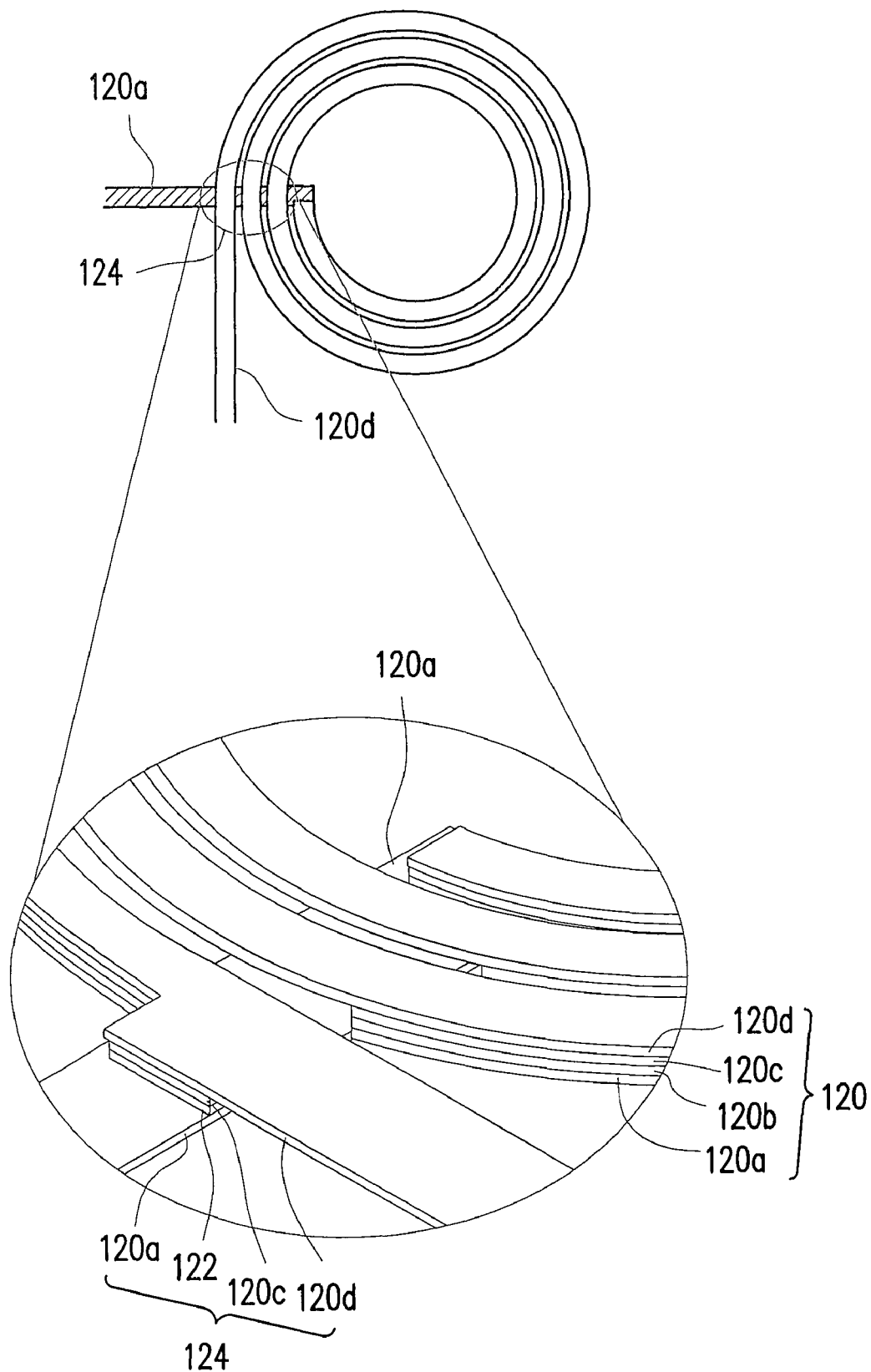
FIG. 4 is a diagram showing an enlarged capacitor structure according to the embodiments of the present invention.

FIG. 4 is a diagram showing an enlarged capacitor structure according to the embodiments of the present invention. Referring to FIG. 4, the structure of FIG. 3 is described in more detail herein. The connection terminal of the conductive layer 120a at the inner side is, for example, radially interlaced with the winding wire and extended to the outer side. To keep the inductor functions, the inductor has an overlapping structure by using a semiconductor process. In order to make an end of the conductive layer 120a extended towards the outer side and keep an even thickness of the entire inductor, the conductive layers 120a, 120b and 120c of the winding wire are, for example, interrupted. The connection terminal of the conductive layer 120a and the connection terminal of the conductive layer 120d, for example, have a crossly overlapping region used to fabricate the capacitor 124.

Figure 5:
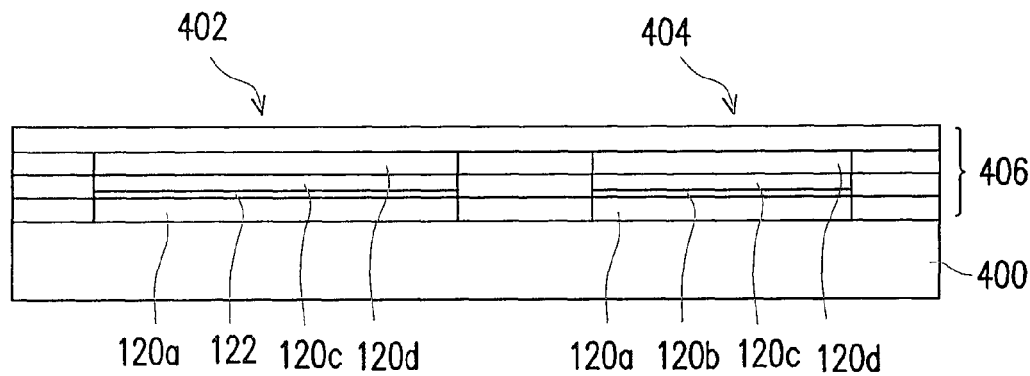
FIG. 5 is a cross-sectional diagram of a resonance structure having an inductor and a capacitor in parallel connection according to an embodiment of the present invention.

FIG. 5 is a cross-sectional diagram of a resonance structure having an inductor and a capacitor in parallel connection according to an embodiment of the present invention. Referring to FIG. 5, the inductor and the capacitor by using a semiconductor process are formed on a substrate 400. A dielectric layer structure with multi layers 406 is used by lithography, etching and deposition processes for forming the conductive layers 120a, 120b, 120c and 120d. A structure region 402 belongs to the cross-sectional structure of the capacitor, and another structure region 404 belongs to the cross-sectional structure of the inductor. The inductor and the capacitor are embedded in the dielectric layer structure 406. Since the capacitor thickness and the thicknesses of each layer of the inductor are preferably equal to each other, the same height of the structure is maintained, which is helpful to obtain the flatness of the structure. The capacitance depends on the area of the capacitor and the thickness of the dielectric layer 122, where the thickness is inversely proportional to the capacitance. In general, a less thickness of the dielectric layer 122 requires a successive thickness of the inductor. The thickness of the conductive layer 120b is adjustable to suit the thickness of the dielectric layer 122 so as to achieve the desired resonance frequency and the device flatness. Note that the above-described design is an embodiment of the present invention only, and does not cover all the present invention.

Figure 6:
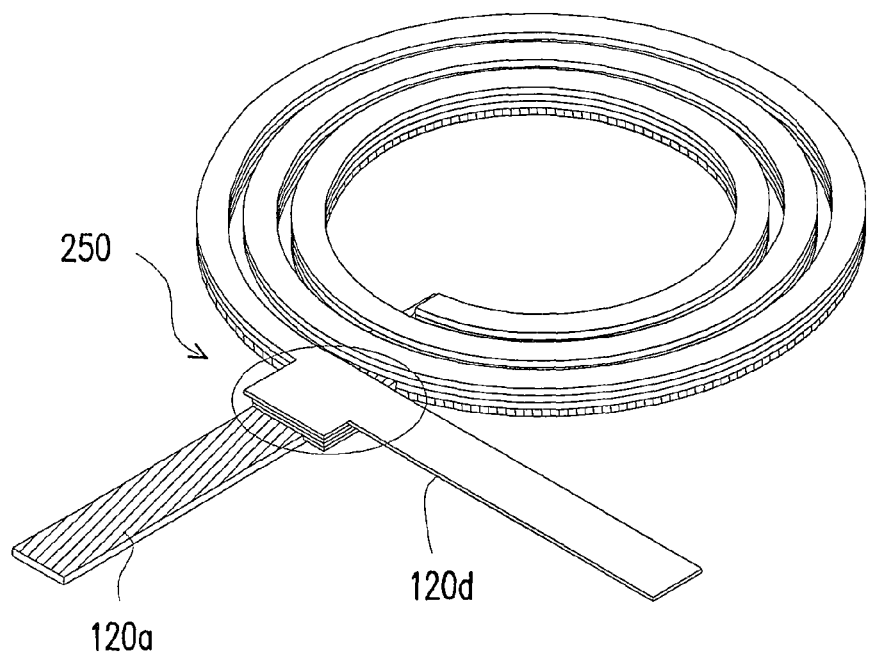
FIG. 6 is a 3-D schematic drawing of a resonance structure having an inductor and a capacitor in parallel connection according to an embodiment of the present invention.
Figure 7:
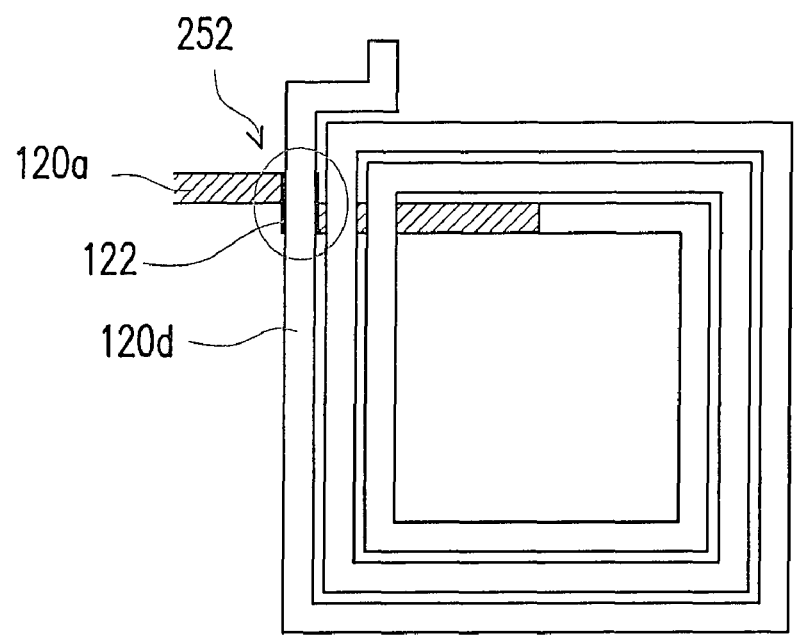
FIG. 7 is a diagram of a resonance structure having an inductor and a capacitor in parallel connection according to an embodiment of the present invention.

FIG. 6 is a 3-D schematic drawing of a resonance structure having an inductor and a capacitor in parallel connection according to an embodiment of the present invention. Referring to FIG. 6, the structure herein is similar to the structure of FIG. 3 except that area of the capacitor 250 can be appropriately adjusted. FIG. 7 is a diagram of a resonance structure having an inductor and a capacitor in parallel connection according to an embodiment of the present invention. Referring to FIG. 7, the winding wire inductor herein can be modified depending on a real need; for example, the winding wire can have a quadrangle outline. The required dielectric layer 122 can be formed within an appropriate region in the overlapping region of the conductive layer 120a and the conductive layer 120d. By manner of the formed dielectric layer 122, a capacitor 252 connected in parallel to the inductor is formed. The position of the capacitor can be adjusted depending on a real need. The stacked layers of the inductor are not necessarily limited to four layers, and allowed to be two conductive layers respectively located at two different elevations. The gap between the two conductive layers at the overlapping position is used to form the dielectric layer 122 with a desired thickness to form a capacitor.

Figure 8:
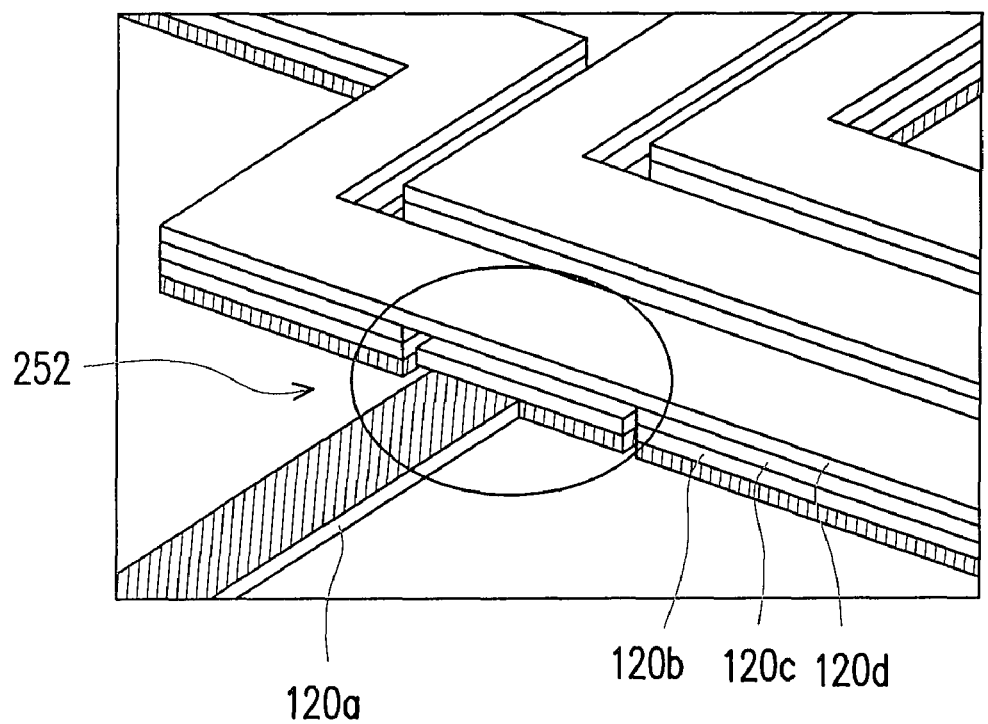
FIG. 8 is a 3-D schematic drawing showing the enlarged capacitor structure of FIG. 7 according to the embodiments of the present invention.

FIG. 8 is a 3-D schematic drawing showing the enlarged capacitor structure of FIG. 7 according to the embodiments of the present invention. Referring to FIG. 8, the structure of the capacitor 252 is implemented by manner of the width of the conductive layer itself; thus, the capacitor device does not occupy an additional area. The capacitor 252 of the embodiment is formed on the wire at the most-outer turn. Once needed, a plurality of capacitors can be formed at a plurality of overlapping regions of the conductive layer 120d and the conductive layer 120a of each turn of the winding wire, which depends on the design of a real application circuit.

Figure 9:
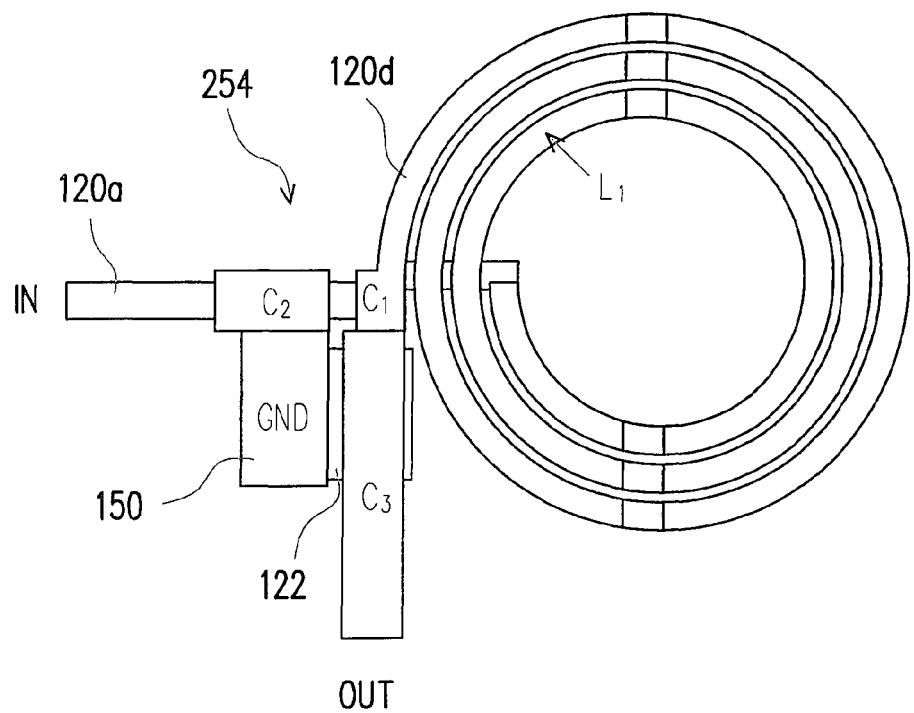
FIG. 9 is a diagram of a lowpass filter as shown in FIG. 1 fabricated with a structure having an inductor and a capacitor in parallel connection according to an embodiment of the present invention.

FIG. 9 is a diagram of a lowpass filter as shown in FIG. 1 fabricated by manner of a structure having an inductor and a capacitor in parallel connection according to an embodiment of the present invention. Referring to FIG. 9, a winding wire inductor L1 has a bottom conductive layer 120a and a top conductive layer 120d. An end of the bottom conductive layer 120a is served as, for example, an input end IN and another end of the top conductive layer 120d is served as, for example, an output end OUT. The capacitor C1 herein is connected in parallel to the inductor L1, the same as the previously introduced structure. In addition, the input end IN of the bottom conductive layer 120a and a grounded conductive layer 150 over the dielectric layer 122 together form a capacitor C2. Further, the output end OUT of the top conductive layer 120d, the dielectric layer 122 and a grounded conductive layer under the dielectric layer 122 and covered by the dielectric layer 122 together form a capacitor C23. In this situation, a set of capacitors 254 having three capacitors is formed adjacently to the inductor L1. In other words, the present invention is allowed to effectively combine the capacitor with the inductor, which has at least an advantage of reducing the device area.

Figure 10:
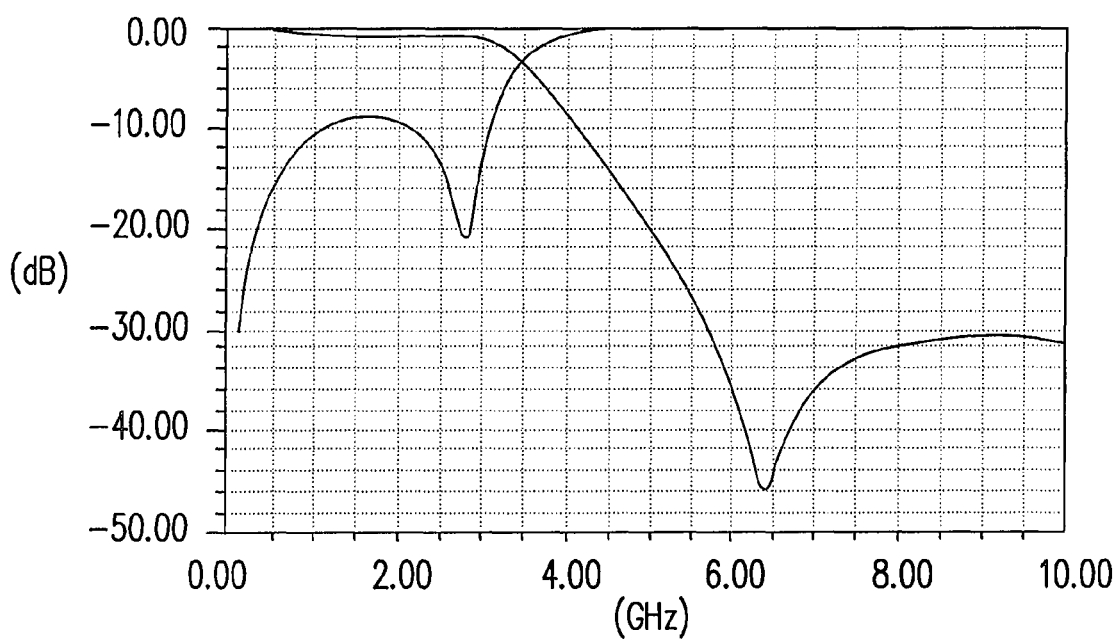
FIG. 10 is a graph showing the efficiency of a filter according to the embodiments of the present invention.

FIG. 10 is a graph showing the efficiency of a filter according to the embodiments of the present invention. Referring to 10, the abscissa herein is for frequency (GHz) and the ordinate is for simulated frequency response (dB). It can be seen from FIG. 10, the lowpass filter with the circuit device provided by the present invention has a quite good frequency response with successive filtering capacity.

The foregoing description of the preferred embodiment of the invention is for purposes of explain the present invention, and the present invention is not limited to the cited embodiments. In terms of the stacked layer structure of the inductor, the stacked layers are not limited to four layers only. The preferred design of an inductor is a planar spiral inductor; the turn number of the inductor can be an integer or a non-integer; the position of the capacitor can be adjusted to suit the overlapping region; the area of the capacitor can be, for example, greater than, equal to or less than the wire width of the winding wire.

Note that if the required capacitor area is greater than the area of the overlapping region of the first end circuit and the second end circuit of the inductor, the area of the capacitor can be distributed, for example, along the winding circuit of the most-outer turn towards the second end of the inductor. The outline shape of the inductor can be, for example, circle, square, rectangle or other figures. The planar inductor can be, for example, symmetrical or unsymmetrical.

The circuit layout of the present invention takes the overlapping region of the circuits between the first connection terminal and the second connection terminal as a capacitor. Since the circuit wire width of the first connection terminal and the second connection terminal can be adjusted easily, therefore, a desired capacitance is conveniently obtained. The capacitor in the resonance structure having an inductor and a capacitor in parallel connection is able to fully utilize the overlapping region of the circuits between the first connection terminal and the second connection terminal of the inductor without employing an extra capacitor but the inductor. In addition, the present invention does not require connection lines between the inductor and the capacitor, which reduces the effect caused by the connection lines and saves the chip design area occupied by the connection lines.

Besides, the capacitor can be formed by using the overlapping region of the connection terminals, and the inductor is not necessarily a planar structure because only a capacitor needs to be fabricated at a connection terminal adjacently to the overlapping region.

The above described are preferred embodiments of the present invention only, which do not limit the implementation scope of the present invention. It will be apparent to those skilled in the art that various modifications and equivalent variations can be made to the structure of the present invention without departing from the scope or spirit of the invention.

What is claimed is:

1. A circuit device having a planar inductor and a first capacitor in parallel connection, comprising:

the planar inductor, embedded in a dielectric material layer, wherein the planar inductor has a winding wire portion, a first connection terminal and a second connection terminal, the first connection terminal and the second connection terminal are located at different elevations and have an overlapping region; and a capacitor dielectric layer, located within the overlapping region between the first connection terminal and the second connection terminal, wherein the capacitor dielectric layer and the first connection terminal and the second connection terminal together form the first capacitor, wherein the planar inductor comprises a plurality of conductive layers, wherein the plurality of conductive layers comprise a top conductive layer and a bottom conductive layer respectively served as the first connection terminal and the second connection terminal, wherein the capacitor dielectric layer is corresponding to one of at least one inner layer of the plurality of conductive layers, and the capacitor dielectric layer and the corresponding one of the at least one inner layer substantially have a same thickness and a same elevation.

2. The circuit device having the planar inductor and the first capacitor in parallel connection according to claim 1, wherein the first capacitor and the winding wire portion of the planar inductor are adjacent to each other.

3. The circuit device having the planar inductor and the first capacitor in parallel connection according to claim 1, wherein the first capacitor contains a portion of the winding wire portion.

4. The circuit device having the planar inductor and the first capacitor in parallel connection according to claim 1, wherein the first capacitor further comprises a conductive layer between the first connection terminal and the second connection terminal to maintain a space distance between the first connection terminal and the second connection terminal, wherein the space distance is matched with a thickness of the conductive layer and a thickness of the dielectric layer of the first capacitor.

5. The circuit device having the planar inductor and the first capacitor in parallel connection according to claim 1, wherein the first capacitor is adjacent to the winding wire portion of the planar inductor.

6. The circuit device having the planar inductor and the first capacitor in parallel connection according to claim 1, wherein a number of the plurality of conductive layers of the planar inductor is four.

7. The circuit device having the planar inductor and the first capacitor in parallel connection according to claim 6, wherein the top conductive layer and the bottom conductive layer of the planar inductor are further served as an upper electrode and a lower electrode of the first capacitor.

8. The circuit device having the planar inductor and the first capacitor in parallel connection according to claim 1, further comprising:
a second capacitor, electrically connected to the first connection terminal; and
a third capacitor, electrically connected to the second connection terminal.

9. The circuit device having the planar inductor and the first capacitor in parallel connection according to claim 8, wherein the first capacitor, the second capacitor and the third capacitor are substantially adjacent to each other.

10. The circuit device having the planar inductor and the first capacitor in parallel connection according to claim 1, wherein the winding wire portion of the planar inductor is a winding wire, wherein the winding wire is wounded from an outer side towards an inner side, the first connection terminal is located at the outer side, the second connection terminal is interlaced with the winding wire from an end of the winding wire at the inner side and reaches the outer side, and the second connection terminal is crossly overlapped with the first connection terminal to form the overlapping region.

11. A circuit device having an inductor and a capacitor in parallel connection, comprising:
the planar inductor, embedded in a dielectric material layer, wherein the planar inductor comprises a plurality of conductive layers having a top conductive layer and a bottom conductive layer respectively serving as a first connection terminal and a second connection terminal, wherein the top conductive layer and the bottom conductive layer are located at different elevations and have an overlapping region; and
a capacitor dielectric layer, at least located within the overlapping region between the top conductive layer and the bottom conductive layer, wherein the capacitor dielectric layer and the top conductive layer and the bottom conductive layer together form the first capacitor, herein the overlapping region contains at least a portion of an area region covered by the planar inductor,
wherein the capacitor dielectric layer is corresponding to one of at least one inner layer of the plurality of conductive layers, and the capacitor dielectric layer and the corresponding one of the at least one inner layer substantially have a same thickness and a same elevation.

12. The circuit device having the planar inductor and the first capacitor in parallel connection according to claim 11, wherein the planar inductor comprises a winding wire portion.

13. The circuit device having the planar inductor and the first capacitor in parallel connection according to claim 11, wherein the first capacitor contains a portion of the winding wire portion.

14. The circuit device having the planar inductor and the first capacitor in parallel connection according to claim 11, wherein the first capacitor further comprises a conductive layer between the top conductive layer and the bottom conductive layer to maintain a space distance between the top conductive layer and the bottom conductive layer, wherein the space distance is matched with a thickness of the conductive layer and a thickness of the dielectric layer of the first capacitor.

15. The circuit device having the planar inductor and the first capacitor in parallel connection according to claim 11, wherein the first capacitor is adjacent to the winding wire portion of the planar inductor.

16. The circuit device having the planar inductor and the first capacitor in parallel connection according to claim 11, wherein a number of the plurality of conductive layers of the planar inductor is four.

17. The circuit device having the planar inductor and the first capacitor in parallel connection according to claim 16, wherein the top conductive layer and the bottom conductive layer of the planar inductor are respectively further served as an upper electrode and a lower electrode of the first capacitor.

18. The circuit device having the planar inductor and the first capacitor in parallel connection according to claim 11, further comprising:
a second capacitor, electrically connected to the top conductive layer; and
a third capacitor, electrically connected to the bottom conductive layer.

19. The circuit device having the planar inductor and the first capacitor in parallel connection according to claim 18, wherein the first capacitor, the second capacitor and the third capacitor are substantially adjacent to each other.

* * * * *